United States Patent [19]

Shaw et al.

[11] Patent Number: 5,712,905
[45] Date of Patent: Jan. 27, 1998

[54] SEQUENTIAL DIGITAL PROFILE FOR PROCESSING ANALOG SIGNALS

[76] Inventors: Venson M. Shaw; Andrzej Sluzek, both of School of Applied Science, Nanyang Technological University Nanyang Avenue, Singapore, Singapore, 2268

[21] Appl. No.: 490,106

[22] Filed: Jun. 8, 1995

[51] Int. Cl.$^6$ .................................................. H04M 11/00
[52] U.S. Cl. ............................ 379/95; 395/23; 395/2.55; 395/2.82; 380/9
[58] Field of Search ................................ 395/2.55, 2.82, 395/2.3–2.32; 379/95; 380/9, 8, 18, 41

[56] References Cited

U.S. PATENT DOCUMENTS

| | | | |
|---|---|---|---|
| 4,907,274 | 3/1990 | Nomura et al. | 380/30 |
| 5,548,721 | 8/1996 | Denslow | 380/23 |

*Primary Examiner*—Fan Tsang

[57] ABSTRACT

An object of the present invention is to provide a method for creating an unique digital representation of multiple analog signals, and more particularly to provide a method for development of a sequential digital profile from selective incoming analog signals, for the future application in processing analog signals. The method is based performing on-line segmentation of incoming analog signals according to a sequence of threshold values. The results of the segmentation are represented by a sequence of measurements corresponding to selective attributes describing analog signals. Then, the results of segmentation performed for many incoming analog signals are generalized using selective rules, conditions, and algorithms, in order to develop a sequential digital profile from sequences of measurements. Sequential digital profiles can be applied for the encryption, protection and decryption of analog signal sequences through conforming the behavior of front-end-identification fragments and/or inserted identification fragments of the analog signal sequences with provided sequential digital profiles.

2 Claims, 12 Drawing Sheets

SEQUENTIAL DIGITAL PROFILE FOR PROCESSING ANALOG SIGNALS

BACKGROUND OF THE INVENTION

1. Field of the Invention

The present invention is directed in general to digital representation of analog signals, and more particularly to a system for development of sequential digital profiles from selective analog signals, for the future application in processing analog signals.

2. Description of the Background Art

Due to the real-time performance requirements, recent demand for effective digital representation of on-line analog signal message in a wide diversity of emerging transaction-oriented applications such as smart card, signature identification, data security, speech recognition, medical diagnosis, and other applications, have required novel methods to be explored and introduced for improving the real time computation performance of incoming analog signals.

Namely, for these emerging transaction-oriented applications, the signal channels would typically remain silent until selective authorized users have made and initiated a particular request for the channel usage. The incoming signal message will then be comprised of an unique user identification signal, followed by a sequence of commands, and their relevant data. Due to their nature, such transactions can happen at any of the time instances, and occur in a totally random order.

Therefore, unless prior to the entire signal conversion is completed, selective digital representation can be made available to facilitate the on-line computation and verification of the user identification signal, it is really not possible to predict, anticipate and schedule these events in real time employing traditional scheduling, optimization, and computation methods as described in the background arts.

On the other hands, there are plenty of background arts which taught digital representation methods for the traditional time-continuous processing applications, namely digitization, coding, and signal conversion methods which continuously allow the entire analog signal for translating into an efficient digital representation. Nevertheless, the major objective of these background arts would be to provide parallel and/or pipeline hardware computation for digital representation after the entire signal conversion is completed. For example, Pulse Code Modulation (PCM), Fast Fourier Transform (FFT), and Discrete Cosine Transform (DCT) methods have been illustrated by Stem S. D. and Hush, D. R., in "Digital Signal Analysis", Prentice Hall, 1990, Michael Julian in "Circuit, Signal and Devices", John Wiley and Sons, 1989, and Rao S., Kailath T. in "Regular Iterative Algorithm and Their Implementation in Processor Arrays" Proceeding of IEEE 1988.

In the relevant field of cryptography, similar situation remains. Namely, there are plenty of background arts which taught how to apply sophisticated digital mathematical algorithms, protocols, or coding techniques to improve the design of a digital representation for the stored security key and the embedded encryption algorithm. For example, Man Y. R. in "Cryptography and Secure Communications", McGraw Hill, 1994, and Shannon in "A Mathematical Theory of Communications", Bell System Technical Journal, Volume 27, 1948. However, no matter how complex the algorithm may be, a single digital representation can only translate into a single analog waveform representation for a stored key. Therefore, for highly confidential signal communications, although it is extremely desirable to apply multiple analog waveforms for assisting the encryption of the signal sequence, since multiple digital algorithms are required, this is often discouraged due to the difficulty, complexity, and cost associated with the real-time on-line decryption.

These methods, though practical, are obviously ineffective for the transaction-processing oriented applications. First, they would require expensive high-speed processing and memory circuits in order to reach the real time performance. Furthermore, these circuits must be constantly active in order to continuously monitor the signal channel for any incoming signal sequence. Finally, none of these methods have ever taught how to discriminate and eliminate the unauthorized or uninterested signals in the analog domain, namely prior to the analog to digital signal conversion, in order to eliminate further storage and processing at the digital domain. It is conceived that these background arts will impose serious cost and power consumption disadvantage for their product implementation, and subsequently limit the market realization potential of these emerging technologies and applications.

In light of these storage and performance problems, prior to acceptance of the entire on-line analog signals and their conversion from analog into the digital domain, some form of novel digital representation method is necessary in order to validate and initiate the transaction process, namely, provide the front-end-detection and discrimination method to prevent unauthorized or uninterested on-line analog signal processing. It would be also necessary to make such method programmable, whereby a single digital representation can be programmed to adapt with various application environments. Finally, it is further necessary to make such computation method simple yet effective so that the product realization can become economical and affordable at the marketplace. To date, no single representation possesses the necessary computation and storage power, yet would only require nominal cost for its implementation, in order to process the incoming analog bit-stream at the necessary real time performance.

SUMMARY OF THE INVENTION

It is therefore an object of the present invention to provide a system method for creating digital representation of analog signals, and more particularly to provide a system method for development of a sequential digital profile from selective incoming analog signals, for the future application in processing analog signals.

It is still further an object of the present invention to generalize said analog signals for including time-domain analog signals representing selective physical phenomena.

It is still further an object of the present invention to perform on-line segmentation of said incoming analog signals according to a sequence of threshold values.

It is still further an object of the present invention to represent results of said segmentation through on-line computation of a sequence of measurements in accordance with selective attributes of said analog signals.

It is further an object of the present invention to determine rules, conditions, and algorithms for the development of said sequential digital profile from said results of segmentation and said sequence of measurements.

It is further an object of the present invention to apply said sequential digital profiles for the encryption, protection and decryption of analog signal sequences through conforming the behavior of front-end-identification fragments and/or inserted identification fragments of said sequences with said sequential digital profiles.

A preferred embodiment of the present invention consists of three modules. The first module is an on-line module incorporating an input device, a memory device, a control unit, and a processing unit. The second module is an off-line module analysing results received from said on-line module in order to develop a sequential digital profile. The third module is a signal generator which can generate random analog signals conforming with said sequential digital profile.

The input device of said on-line module acquires incoming analog signals. The memory device of said on-line module contains a predefined sequence of threshold values. Each element of said sequence of threshold values consists of:

(i) a lower threshold value;

(ii) a higher threshold value.

The memory device of said on-line module is also used to memorize measurements performed by the processing unit of said on-line module.

The control unit of said on-line module supervises other components of said on-line module according to a control algorithm. The general idea of the control algorithm performed by the control unit of said on-line module is as follows:

(i) activate receiving an incoming analog signal by the input device;

(ii) from the memory device, retrieve the first element of said sequence of threshold values, i.e. the first lower threshold value and the first higher threshold value;

(iii) send to the processing unit retrieved lower threshold value and retrieved higher threshold value;

(iv) wait until measurements are received from the processing unit;

(v) memorize said received measurements in the memory device;

(vi) if the retrieved element of said sequence of threshold values is the last one then quit the algorithm;

(vii) retrieve the(next element of said sequence of threshold values and go to (iii).

The algorithm can be interrupted or suspended at any moment when no incoming analog signal is available from the input device.

The algorithm should be run (using the same sequence of threshold values) for several incoming analog signals representing the same class of signals.

The processing unit of said on-line module performs selective operations on said incoming analog signals. This includes on-line attribute measurements according to the predefined list of attributes, and on-line segmentation according to the range thresholds (i.e. the lower threshold and the higher threshold) received from the control unit. The general idea of the operations performed by the processing unit is as follows:

(i) perform on-line computation of attribute measurements, until the magnitude of the incoming signal is within said range received from the control unit (detecting the beginning of a segment); the computed measurements are called off-segment attribute measurements;

(ii) perform on-line computation of attribute measurements, until the magnitude of the incoming signal quits said range received from the control (detecting the end of a segment), the computed measurements are called in-segment attribute measurements;

(iii) send the computed off-segment attribute measurements and in-segment attribute measurements to the control unit, and go to (i).

It is envisaged that in the practical applications of the invention selected steps of both above-mentioned algorithms can be performed parallelly and/or asynchronously in order to minimize delays and avoid discontinuities in processing the incoming analog signals.

The off-line module of the preferred embodiment interprets the results received from said on-line module in order to develop a sequential digital profile. The off-line module can be a general purpose computing system which has an access to the content of said memory device of the on-line module.

A single sequential digital profile consists of the following components:

(a) a sequence of samples consisting of two values: a lower threshold value and a higher threshold value (the range of a sample);

(b) a list of attributes divided into two subsets: in-segment attributes and off-segment attributes;

(c) attribute values of said list of attributes for each sample of said sequence of samples.

The following analysis is performed to create the above-mentioned components of a sequential digital profile:

(a) said sequence of samples directly corresponds to said sequence of threshold values;

(b) said list of attributes is selected from the attributes which can be measured by said processing unit of the on-line module; the analysis of off-segment measurements received from the on-line module determines which attributes are to be off-segment attributes of said list of attributes, and the analysis of in-segment measurements received from the on-line module determines which attributes are to be in-segment attributes of said list of attributes; human assistance might be required to perform the analysis;

(c) attribute values for each sample of said sequence of samples are determined through the analysis of off-segment measurements and in-segment measurements received from the on-line module for several incoming analog signals.

The third module, i.e. the signal generator of random analog signals conforming with a sequential digital profile taken from the off-line module, consists of the following components:

(a) a general application computing unit with random-number generating facilities;

(b) a memory unit;

(c) a digital-to-analog converter.

Said computing unit generates a digital signal conforming with said sequential digital profile. Said signal is represented by a sequence of numbers randomly generated according to the conditions imposed by said sequential digital profile. Said sequence of numbers is stored in the memory unit. The digital-to-analog converter converts the content of the memory unit into an analog signal. The process of generation of analog signals can be performed either off-line (the whole sequence of numbers is memorized, and then converted to an analog signal) or on-line (each generated number of said sequence of numbers is immediately converted to an analog value) depending on the performances of said computing unit.

BRIEF DESCRIPTION OF THE DRAWINGS

The present invention will become more fully understood from detailed description given herein below and the accompanying drawings which are given by way of illustration only, and thus are not limitative of the present invention and wherein.

DESCRIPTION OF THE PREFERRED EMBODIMENT

In the following description, particular reference is made to the implementation of the invention in the context of processing voltage signals. It is envisaged, however, that the practical applications of the invention can be extended to many other areas in which selective physical phenomena would be represented by the analog, time-domain signals.

Figure 1:
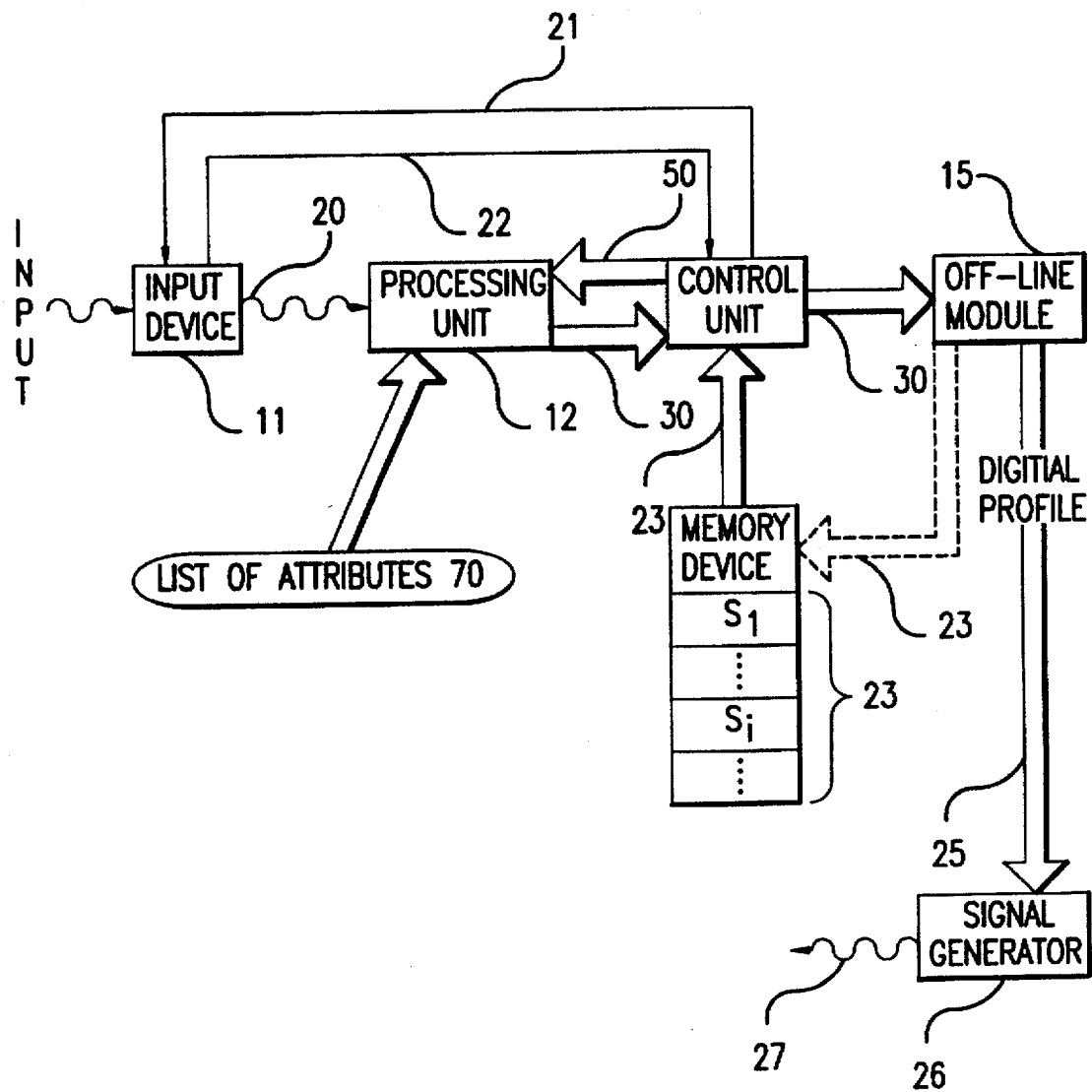
FIG. 1 is a general block diagram illustrating major components and data flow in a preferred embodiment of the present invention.

Referring to FIG. 1, the preferred system in which the present invention would be applied consists of the on-line module 10 and the off-line module 15. The on-line module 10 incorporates the input device 11, the processing unit 12, the control unit 13, and the memory device 14

Incoming analog signals 20 are acquired from the input device 11, which is capable to capture continuously the magnitude of the signals. Acquisition of an incoming signal is activated by the signal 21 received from the control unit 13. The incoming signal 20 will be denotes as X(t). The signal 12 is to inform the control unit that no incoming signal is being received. Usually this should suspend or interrupt the control algorithm run by the control unit 13.

The incoming signal 10 is processed in the processing unit 12 according to the predefined list of attributes 70, and the range 50 (determined by the higher threshold value 51 and the lower threshold value 52) received from the control unit 13. This includes extraction of continuous segments of the incoming signal 20 being within the range 50, as well as computation of attribute measurements 30 according to the attributes 70. The processing unit 12 is equipped with the devices capable to perform the required computation on-line. The computed attribute measurements 30 are sent to the control unit 13.

The control unit 13 runs a control algorithm, memorizes in the memory device 14 the attribute measurements 30 received from the processing unit 12, and retrieves the sequence of threshold values 23 from said memory device 14. The range 50 (i.e. the threshold values 51 and 52) which is being send to processing 12 is extracted from the sequence of threshold values 23.

The off-line module 15 accumulates the attribute measurements 30 extracted from the memory device 14 in order to create a sequential digital profile 25. The off-line module 15 can be also used to load the sequence of threshold values 23 to said memory device 14.

A sequential digital profile 25 is sent to the signal generator 26 which can generate random analog signals 27 conforming with said sequential digital profile 25.

Figure 2:
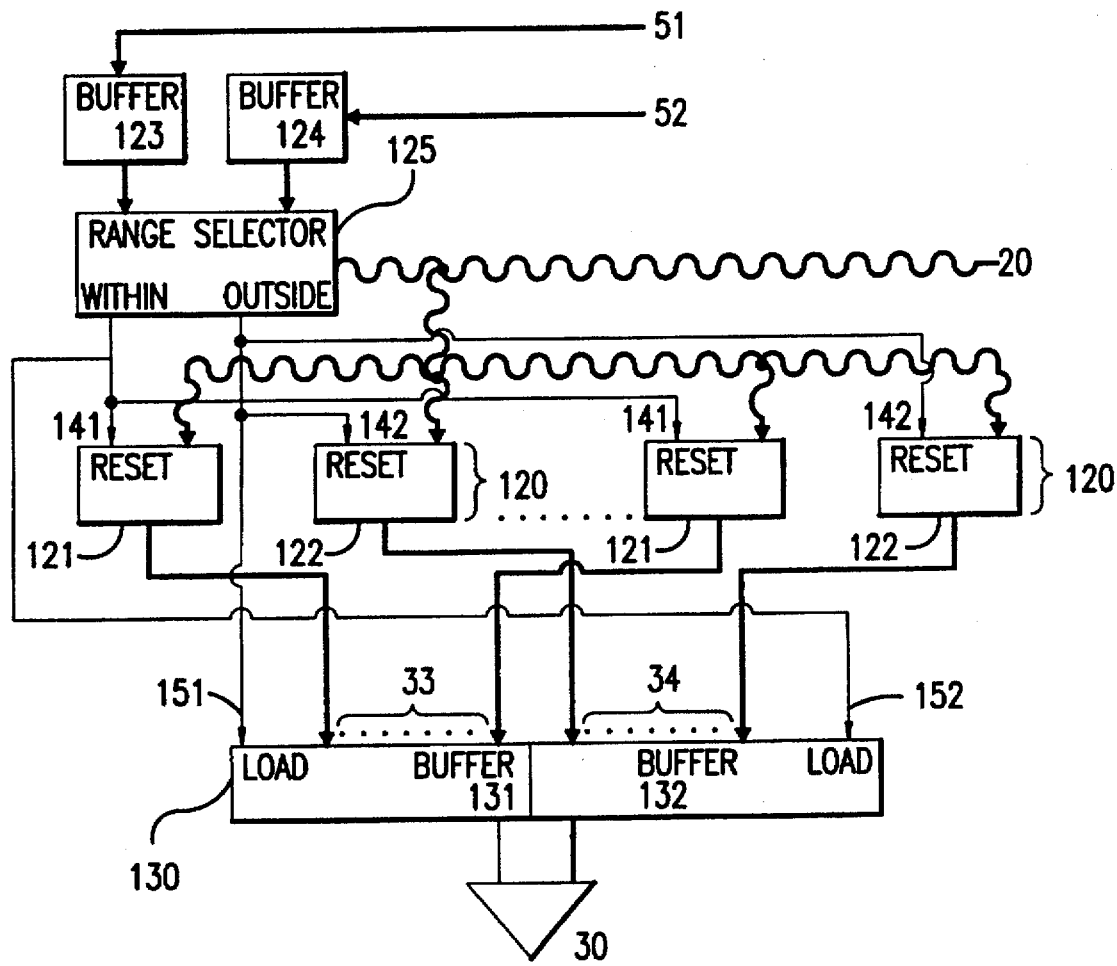
FIG. 2 shows a general structure of the processing unit.

Referring to FIG. 2, a general structure of the processing unit 12 comprises the following components:

the modules 120 performing on-line computation of attribute measurements 30 for the predetermined list 70 of M attributes {A1, A2, ..., AM}; in order to improve on-line performances of the system, each module 120 consists of two identical units 121 and 122; the unit 121 performs off-segment measurements 33 while the unit 122 performs in-segment measurements 34;

the threshold buffers 123 and 124 containing the higher threshold value 51 and the lower threshold value 52 respectively;

the range selector 125 detecting whether the current magnitude of the incoming signal 20 is within the range defined by the thresholds 51 and 52 received from the buffers 123 and 124 respectively;

the measurement buffer 130 (consisting of the off-segment buffer 131 and the in-segment buffer 132) memorizing the attribute measurements 30 comprising the off-segment measurements 33 and the in-segment measurements 34, wherein the off-segment attribute measurements 33 are received from the modules 121 and memorized in the buffer 131, while the in-segment attribute measurements 34 are received from the modules 122 and memorized in the buffer 132.

The reset signals 141 and the load signal 151 are arranged so that the off-segment measurements 33 are computed when the incoming signal 20 is outside the range defined by the thresholds 51 and 52, and said measurements are memorized in the buffer 131 when the incoming signal 20 enters said range.

The reset signals 142 and the load signal 152 are arranged so that the in-segment measurements 34 are computed when the incoming signal 20 is within the range defined by-the thresholds 51 and 52, and said measurements are memorized in the buffer 132 when the incoming signal 20 quits said range.

Figure 3:
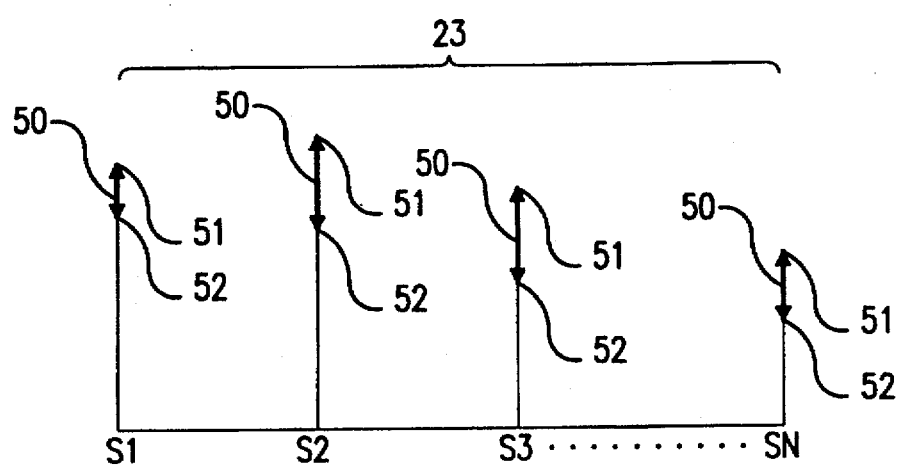
FIG. 3 shows a general structure Of a sequence of threshold values.

Referring to FIG. 3, the sequence of threshold values 23 stored in the memory device 14 consists of N elements {S1, S2, ..., SN} wherein each Si incorporates:

(i) the higher threshold value HTi (51);

(ii) the lower threshold value LTi (52).

Figure 4:
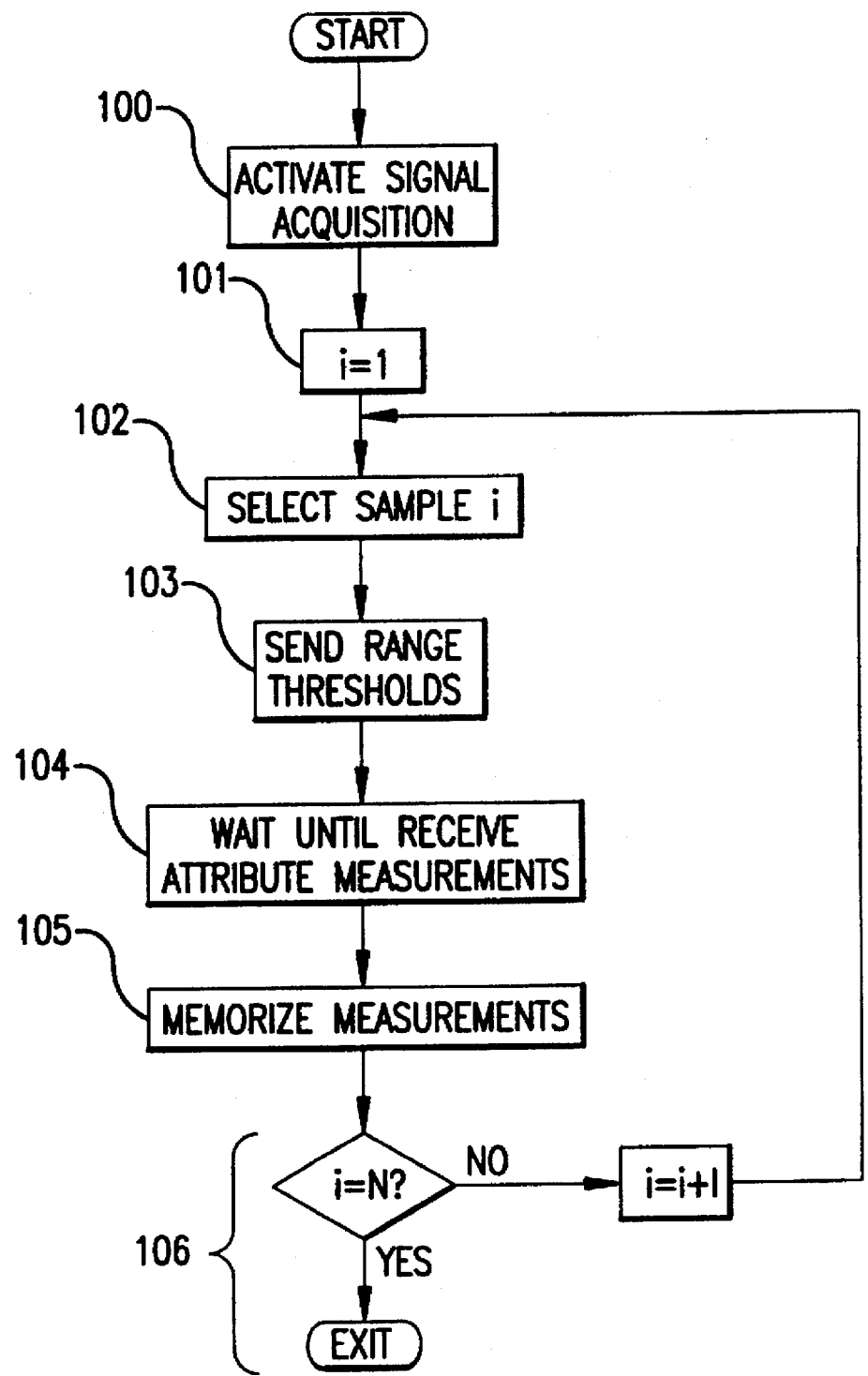
FIG. 4 is a flowchart illustrating in a broad sense the steps of the algorithm performed in the control unit of the preferred embodiment of the present invention.

Referring to FIG. 4, the algorithm performed in the control unit 13 comprises the following steps:

Step 100 Send the signal 21 to initialize acquisition of an incoming analog signal 20 X(t) from the input device 11.

Step 101 Set i=1.

Step 102 Retrieve the element Si from the sequence of threshold values 23.

Step 103 For the retrieved element Si, send the higher threshold value HTi (51) and the lower threshold value LTi (52) to the buffers 123 and 124 of the processing unit 12.

Step 104 Wait until the off-segment measurements 33 {MeOFA$_1$, MeOFA$_2$, ..., MeOFA$_M$} and the in-segment measurements 34 {MeINA$_1$, MeINA$_2$, ..., MeINA$_M$} are received from the buffers 131 and 132 of the processing unit 12.

Step 105 Memorize the off-segment measurements 33 {MeOFA$_1$, MeOFA$_2$, ..., MeOFA$_M$} and the in-segment measurements 34 {MeINA$_1$, MeINA$_2$, ..., MeINA$_M$} in the memory device 14.

---

Step 106  If (i < N) then
                   i = i + 1; goto Step 102
         else
                   exit.

---

The algorithm can be suspended or terminated at any moment when the signal 22 is received from the processing unit 12, i.e. when no incoming signal 20 is available.

The abovementioned algorithm is given by way of illustration and example only and is not to be taken by way of limitation, so that in the future embodiments other algorithms 15 based on the same principles could be applied. In particular, selected steps of the algorithm can be, performed parallelly, asynchronously or can be pipelined in order to minimize delays and avoid discontinuities in processing the incoming analog signal 20.

Figure 5:
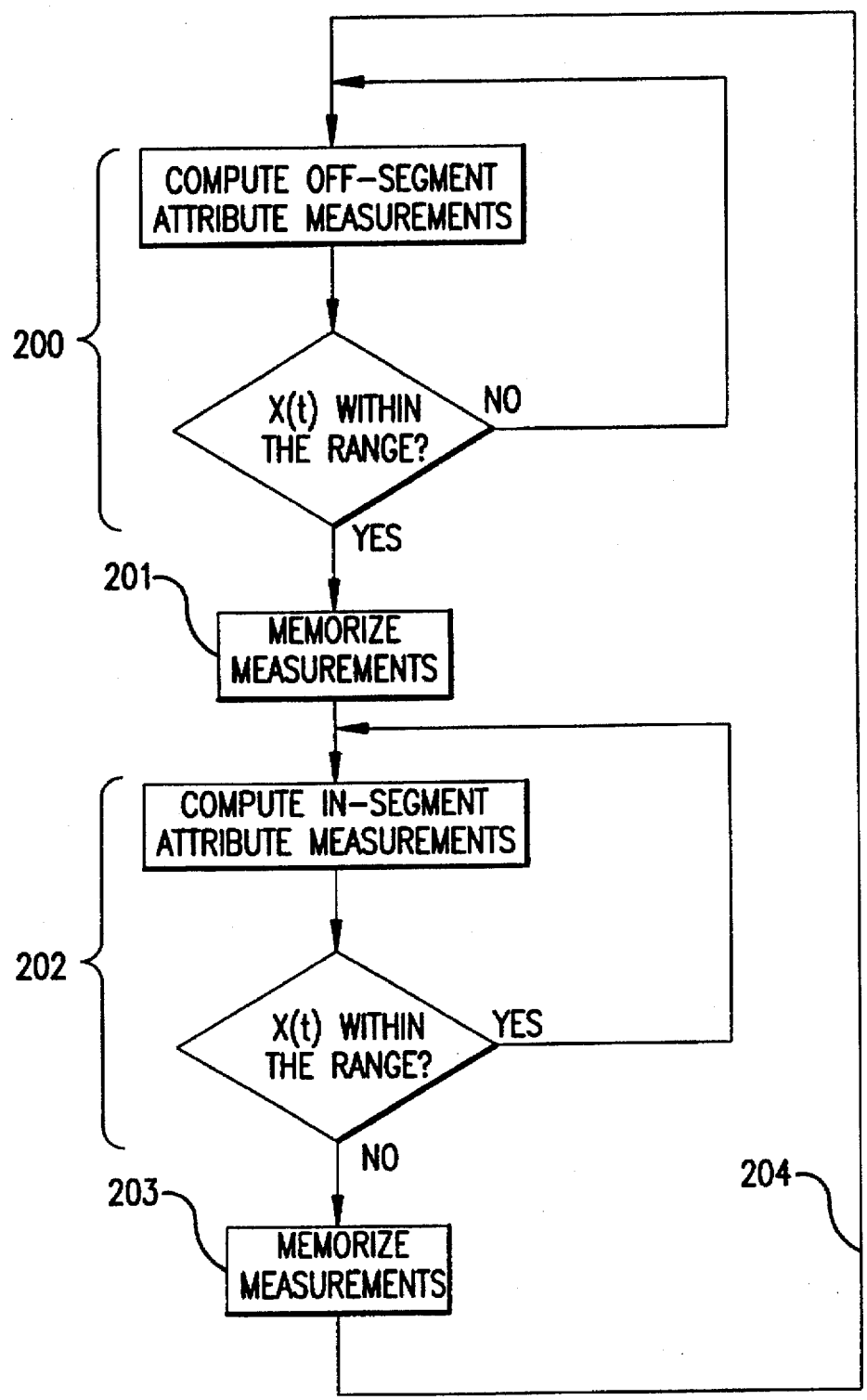
FIG. 5 is a flowchart illustrating in a broad sense the steps of the algorithm performed in the processing unit of the preferred embodiment of the present invention.

Referring to FIG. 5, the algorithm performed in the processing unit 12 has the following structure:

Step 200 Perform on-line computation of off-segment measurements 33 using. modules 121 until the magnitude of X(t) is inside the range defined by the content of the threshold buffers 123 and 124.

Step 201 Memorize said measurements 33 of Step 200 in the measurement buffer 131, and reset the modules 122.

Step 202 Perform on-line computation of in-segment measurements 34 using modules 122 until the magnitude of X(t) is outside the range defined by the content of the threshold buffers 123 and 124.

Step 203 Memorize said measurements 34 of Step 202 in the measurement buffer 132, and reset the modules 121.

Step 204 Goto Step 200.

Figure 6:
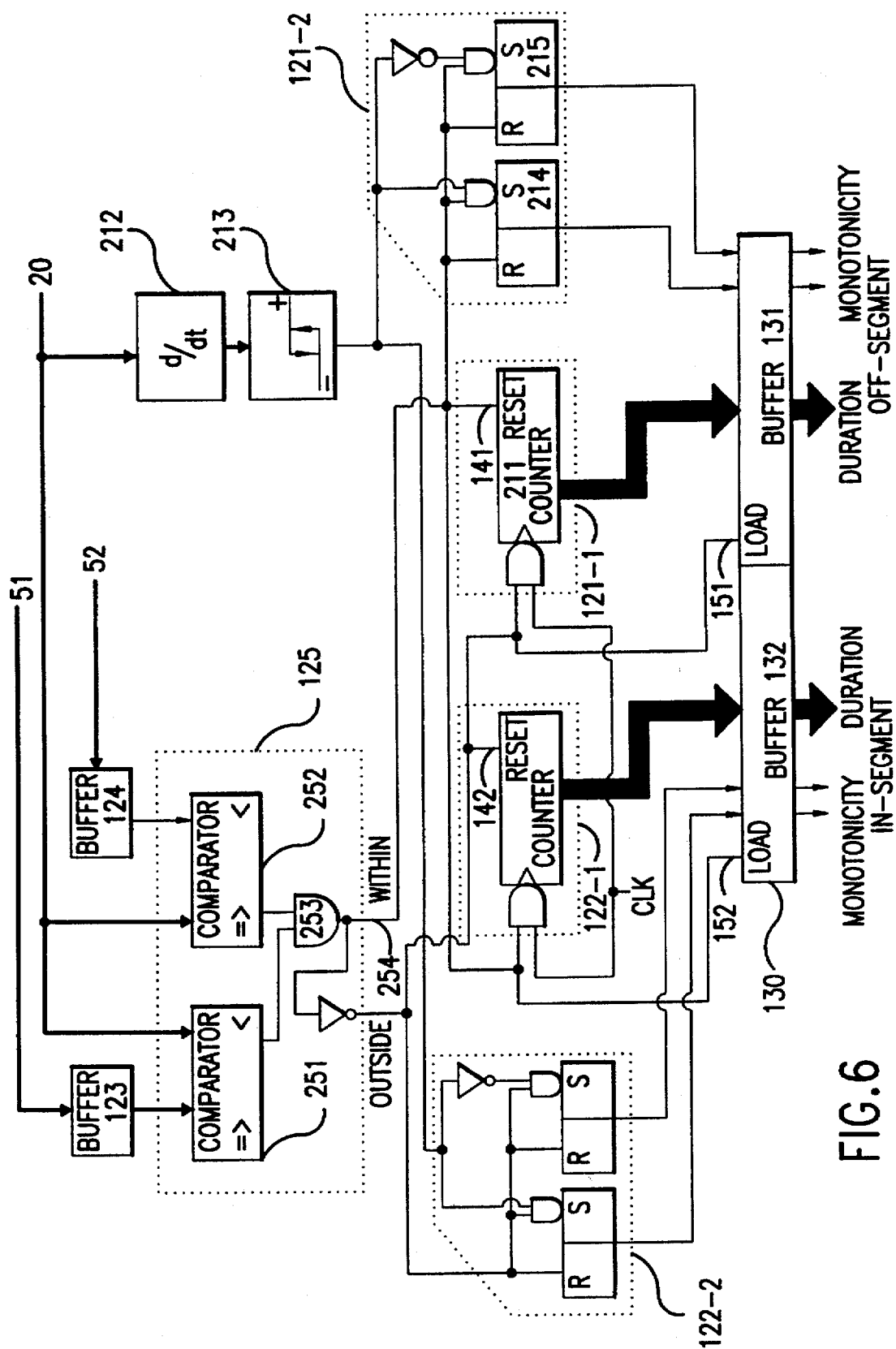
FIG. 6 shows an example of the processing unit which can perform computation of selective attribute measurements.

FIG. 6 shows a design of a processing unit 12 which can perform attribute measurements for the following list of attributes 70:

{A$_1$=Period_of_duration, A$_2$=Type_of_monotonicity}.

The structure of the unit corresponds to the general structure of FIG. 3.

The range selector 125 consists of two analog comparators 251 and 252 comparing the incoming signal 20 to the content of the range buffers 123 and 124 respectively. The AND-gate 253 provides that the binary output 254 of the range selector 125 is set ONE when the incoming signal 20 is within said range, and ZERO otherwise.

There are two modules 121 and two corresponding modules 122, i.e. the modules to perform Period_of_duration measurements, and the modules to perform Type_of_monotonicity measurements. The module 121-1 performing Period_of_duration measurements consists of the digital counter 211 with the reset signal 141 connected to the ouput 254. The clock input of the counter 211 is connected to the external signal generator. The module 121-2 performing Type_of_monotonicity measurements consists of two flip-flops 214 and 215, which receive signals from the differentiating element 212 through the sign detector 213. The small histeresis loop has been added in the sign detector 213 in order to compensate minor variations of the incoming signal 20. The flip-flop 214 is set whenever the derivative of the incoming signal 20 is positive, and the flip-flop 215 is set whenever the derivative of the incoming signal 20 is negative. The reset signal 141 resets the flip-flops 214 and 215 and closes their Set input AND-gates.

The modules 122 have the identical structure to the corresponding modules 121. The only difference is that the reset signal 142 is connected to the inverted output 254.

The measurement buffer 131 is a latch register with two inputs connected to flip-flops 214 and 215, and the rest of inputs connected to the counter 211. The load signal 151 is connected to the inverted output 254.

The measurement buffer 132 is similar to the buffer 131. The only difference is that the load signal 152 is connected to the output 254.

Therefore, the attribute measurements 30 (comprising off-segment measurements 33 and in-segment measurements 34) are represented as follows:

Off-segment Period_of_duration—the corresponding output bits of the buffer 131;

Off-segment Type_of_monotonicity—two output bits of the buffer 131, wherein 01 represents "decreasing";
10 represents "increasing";
11 represents "no_monotonicity";

In-segment Period_of_duration—the corresponding output bits of the buffer 132;

In-segment Type_of_monotonicity—two output bits of the buffer 132, wherein 01 represents "decreasing";
10 represents "increasing";
11 represents "no_monotonicity".

Figure 7:
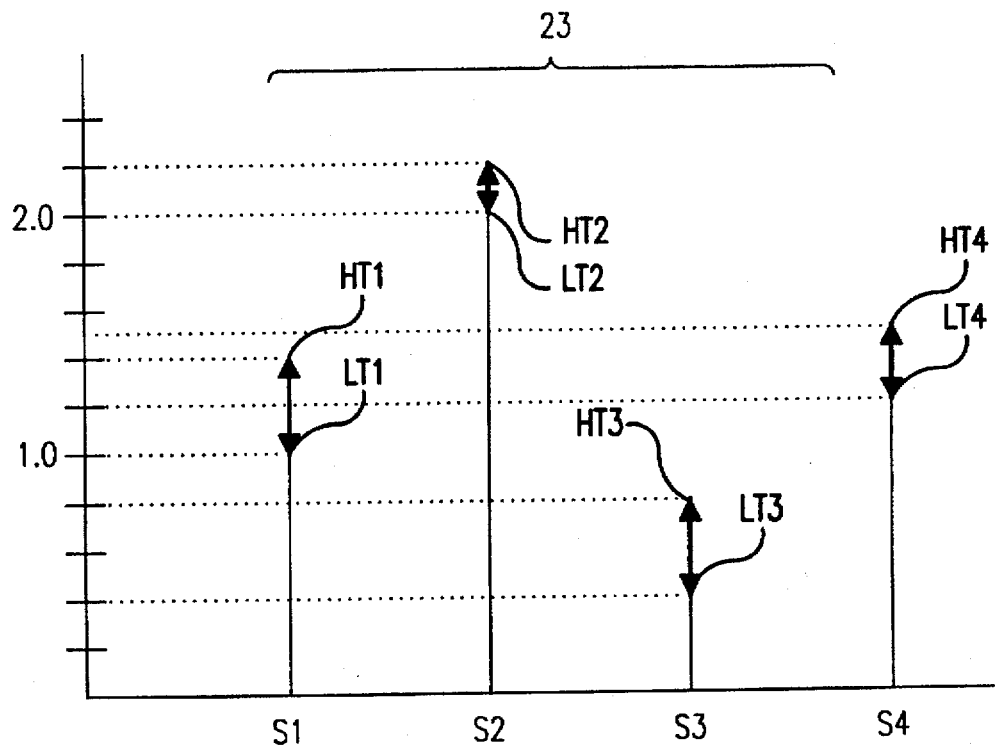
FIG. 7 shows an example of a sequence of threshold values according to the general structure of FIG. 3.
Figure 8:
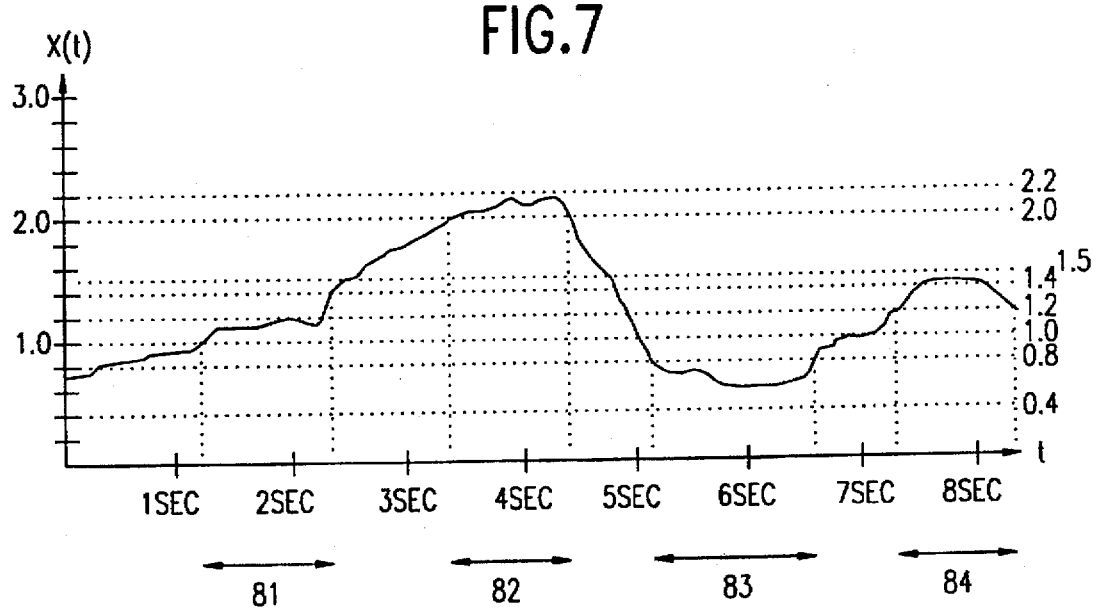
FIGS. 8 to 11 show examples of incoming analog signals and results of the processing performed by the algorithm of FIG. 4 using processing unit of FIG. 6, and the sequence of threshold values of FIG. 7.
Figure 9:
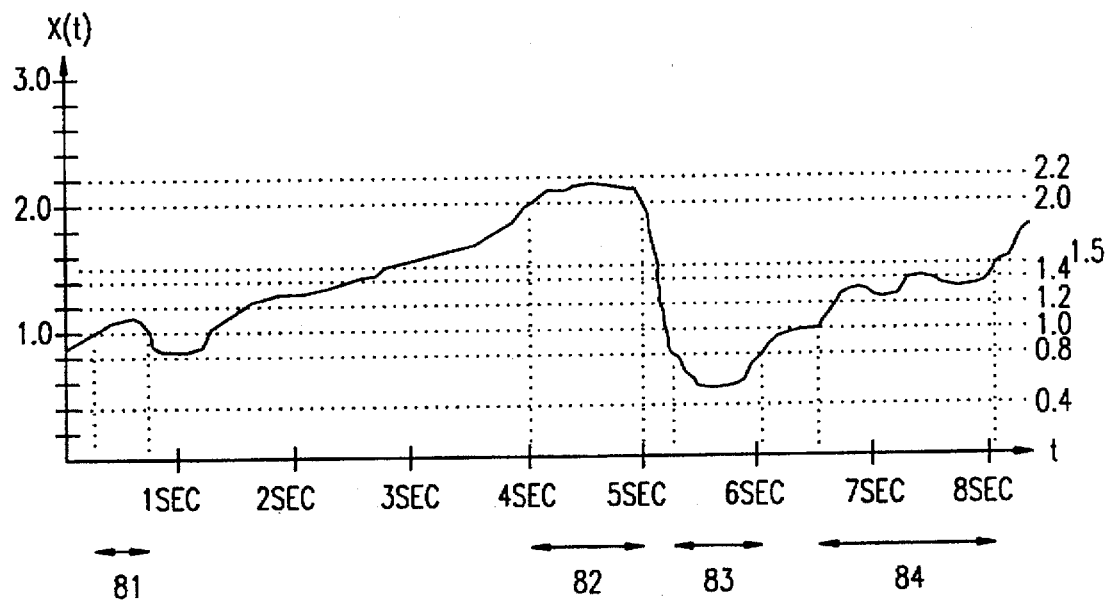
Figure 10:
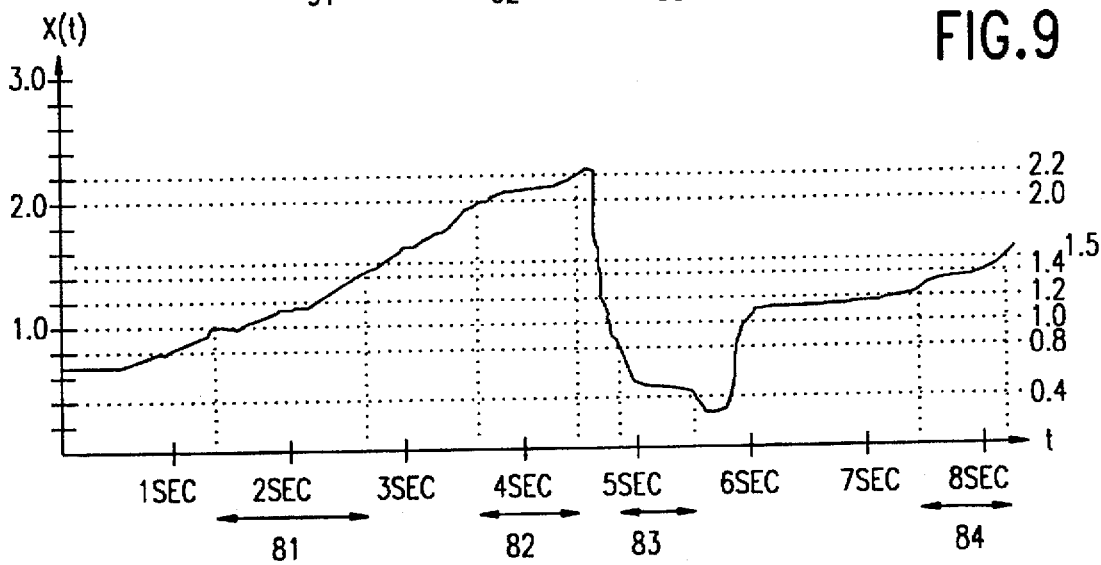
Figure 11:
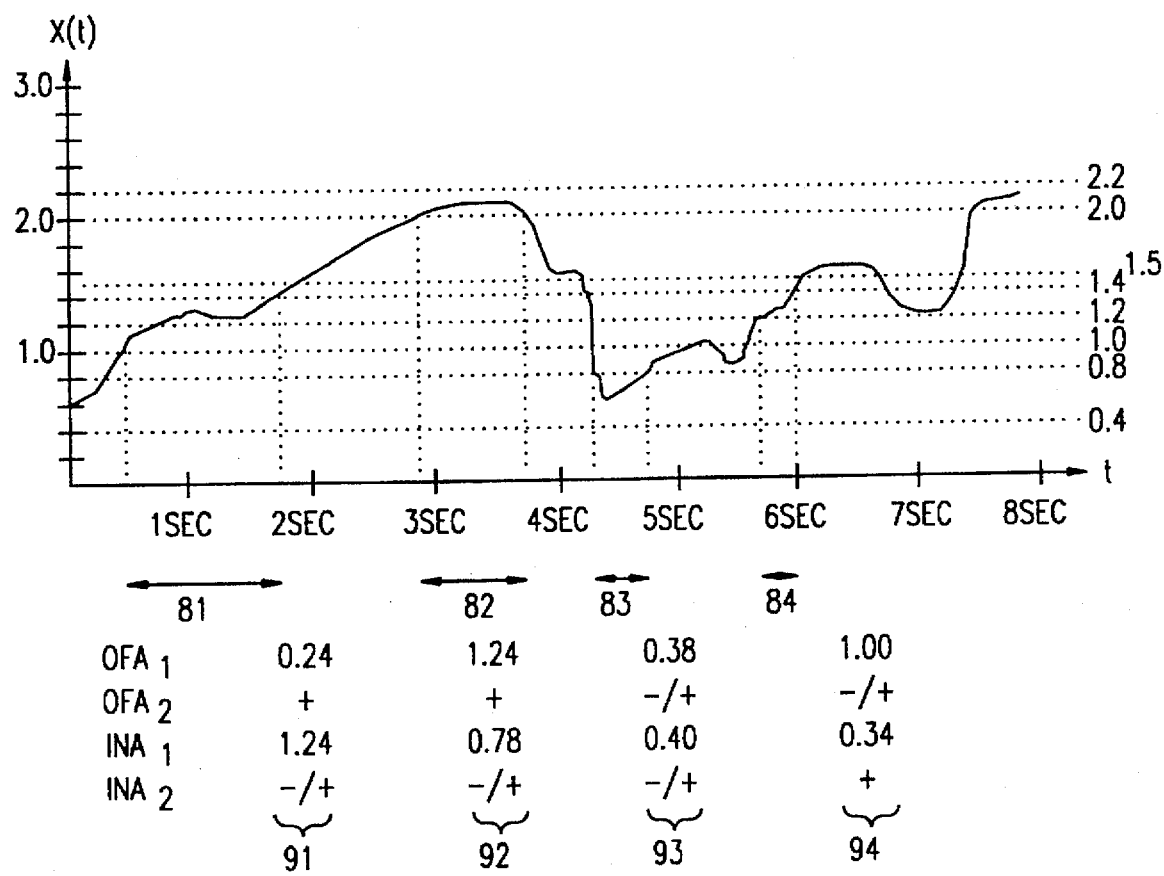

FIG. 7 shows an example of a sequence of threshold values 23 according to the general structure of FIG. 3 wherein:

(i) the sequence of threshold values 23 contains four elements: S1, S2, S3, S4;

(ii) the threshold values 51 and 52 for the given elements are:

| | |
|---|---|
| HT$_1$ = 1.4 | LT$_1$ = 1.0; |
| HT$_2$ = 2.2 | LT$_2$ = 2.0; |
| HT$_3$ = 0.8 | LT$_3$ = 0.4; |
| HT$_4$ = 1.5 | LT$_4$ = 1.2. |

FIGS. 8 to 11 show examples of incoming analog signals 20 being processed by the algorithm of FIG. 4 using processing unit of FIG. 6 and the sequence of threshold values 23 of FIG. 7. The extracted segments 81, 82, 83 and 84 correspond respectively to the elements S1, S2, S3 and S4 from the sequence of threshold values 23. The lists 91, 92, 93 and 94 contain the corresponding attribute measurements 33 and 34, wherein:

OFA$_1$ is the off-segment Period_of_duration,
OFA$_2$ is the off-segment Type_of_monotonicity, -continued INA$_1$ is the in-segment Period_of_duration,
INA$_2$ is the in-segment Type_of_monotonicity,
and
"−" represents "decreasing",
"+" represents "increasing",
"−/+" represents "no_monotonicity".

Sequential digital profiles 25 would be created using:
(i) the sequence of threshold values 23;
(ii) the predetermined list 70 attributes;
(iii) the attribute measurements 33 and 34 computed for the given examples of incoming analog signals 20.

Since the incoming analog signals 20 are supposed to be typical samples of the signals of interest, the corresponding digital profile 25 should be a generalization of the available attributes 70 and the attribute measurements 33 and 34. Said generalization might be performed automatically or might require human assistance.

Figure 12:
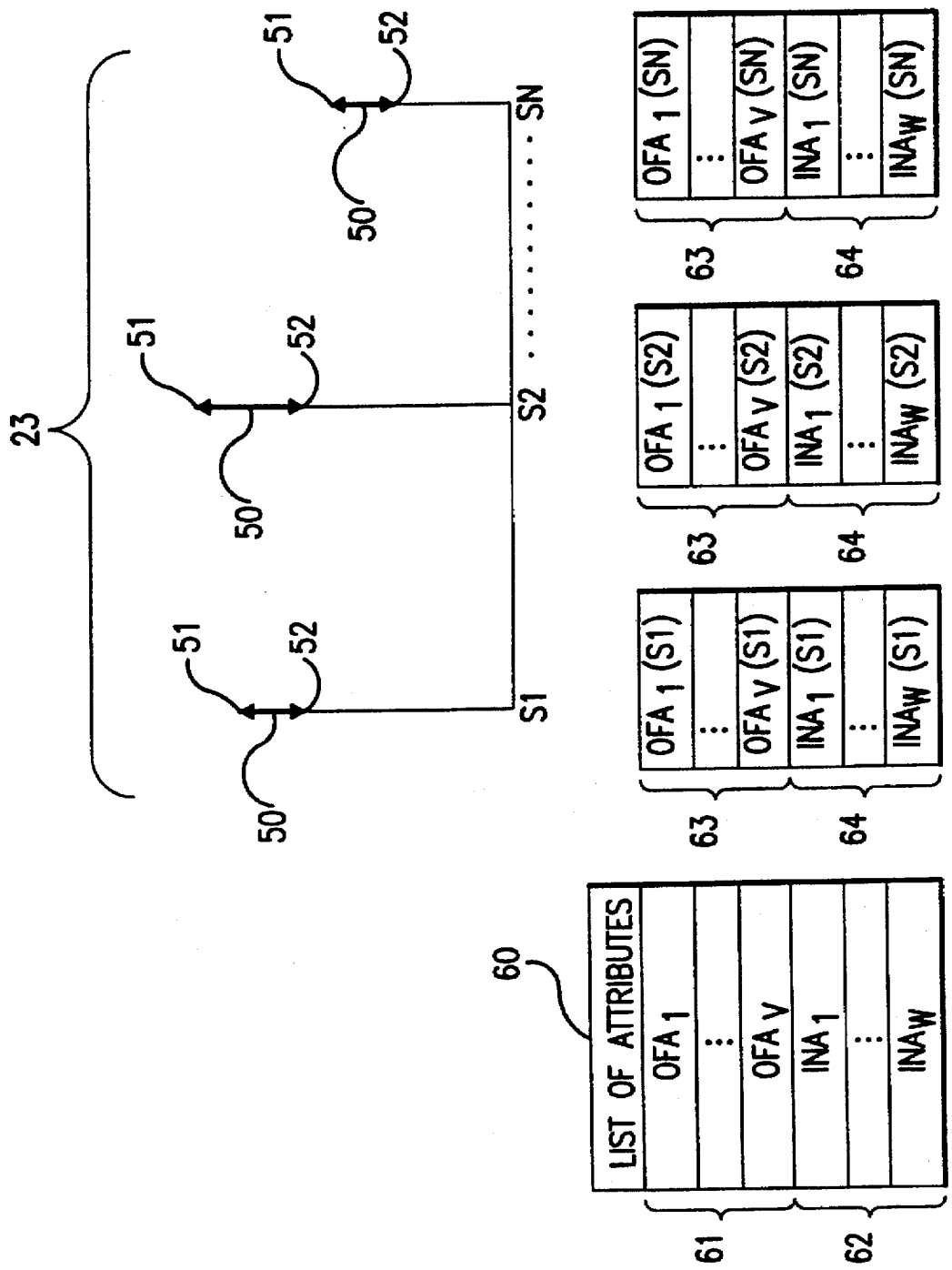
FIG. 12 shows a general structure of a sequential digital profile.

Referring to FIG. 12, sequential digital profiles 25 consist in general of the following components:
(i) the sequence of N samples {S1, S1, . . . , SN} corresponding to the sequence of threshold values 23 stored in the memory device 14, wherein each sample Si (i=1, . . . , N) has its range 50 bounded by the higher threshold value HTi (51) and the lower threshold value LTi (52);
(ii) the list of attributes 60 consisting of off-segment attributes 61 {OFA$_1$, OFA$_2$, . . . , OFA$_v$} and in-segment attributes 62 {INA$_1$, INA$_2$, . . . , INA$_w$}, wherein both off-segment attributes 61 and in-segment attributes 62 are selected from the predetermined list 70 of M attributes {A1, A2, . . . , AM};
(iii) for each sample Si(i=1, . . . , n), the sequence of off-segment attribute values 63 {OFA$_1$(Si), OFA$_2$(Si), . . . , OFA$_v$(Si)};
(iv) for each sample Si (i=1, . . . , N), the sequence of in-segment attribute values 64 {INA$_1$(Si), INA$_2$(Si), . . . , INA$_w$(Si)}.

Figure 13:
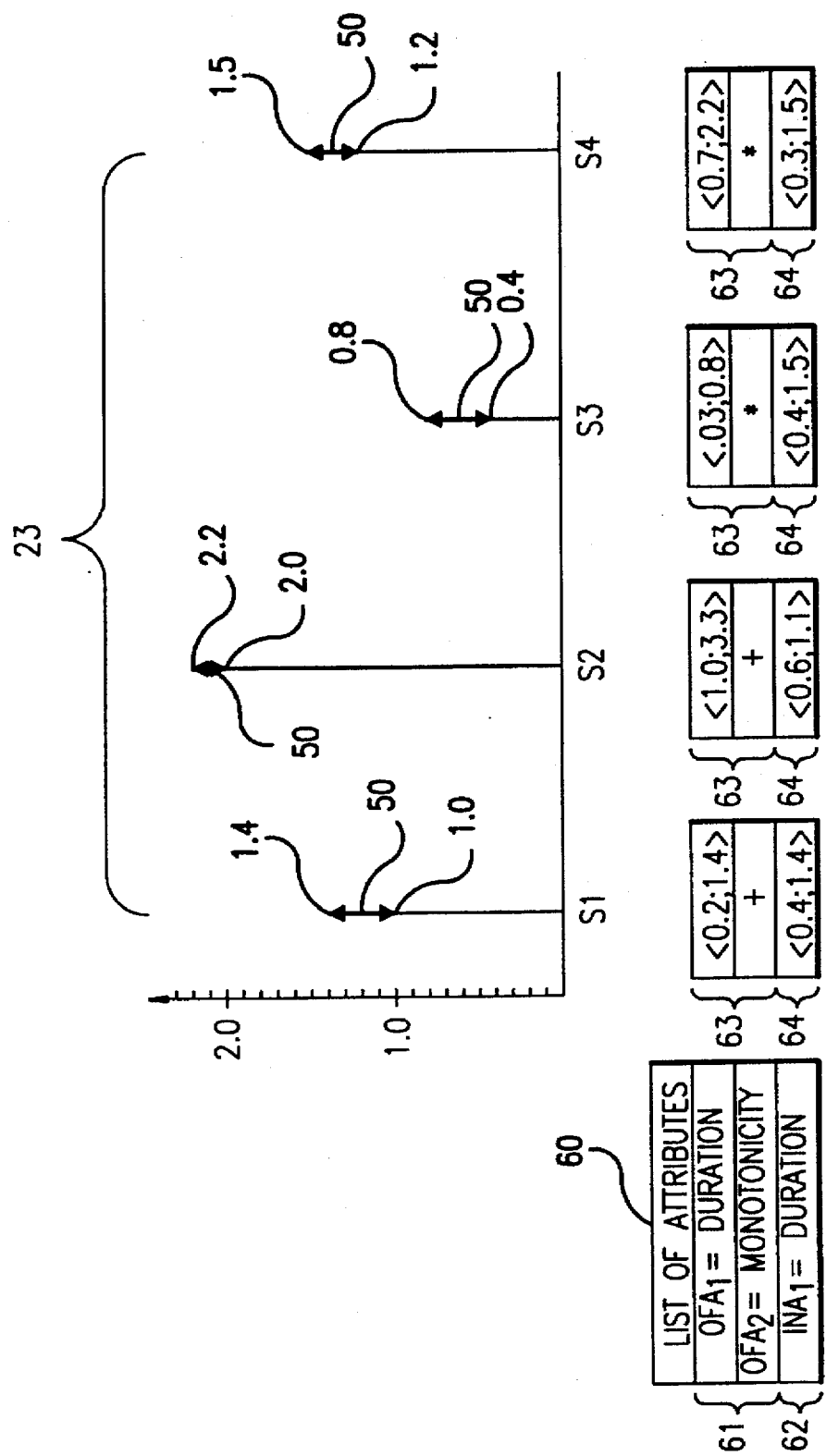
FIG. 13 shows an example of a sequential digital profile obtained from the results shown in FIGS. 8 to 11, according to the general structure of FIG. 12.

Therefore, FIG. 13 shows an example of a sequential digital profile 25 obtained from the results given in FIGS. 8 to 11, according to the general structure of FIG. 12. Note that the in-segment attributes 62 do not include the Type_of_monotonicity attribute. This because for this attribute the natural generalization of the results of FIGS. 8 to 11 would give "don't care" value for each created sample Si (i=1, . . . , 4). The values of the Period_of_duration attribute have been rounded with 0.1 sec accuracy.

The digital profile of FIG. 13 is given by way of illustration and example only and is not to be taken by way of limitation, so that in the future embodiments other methods of generalization based on the same principles could be applied.

Figure 14:
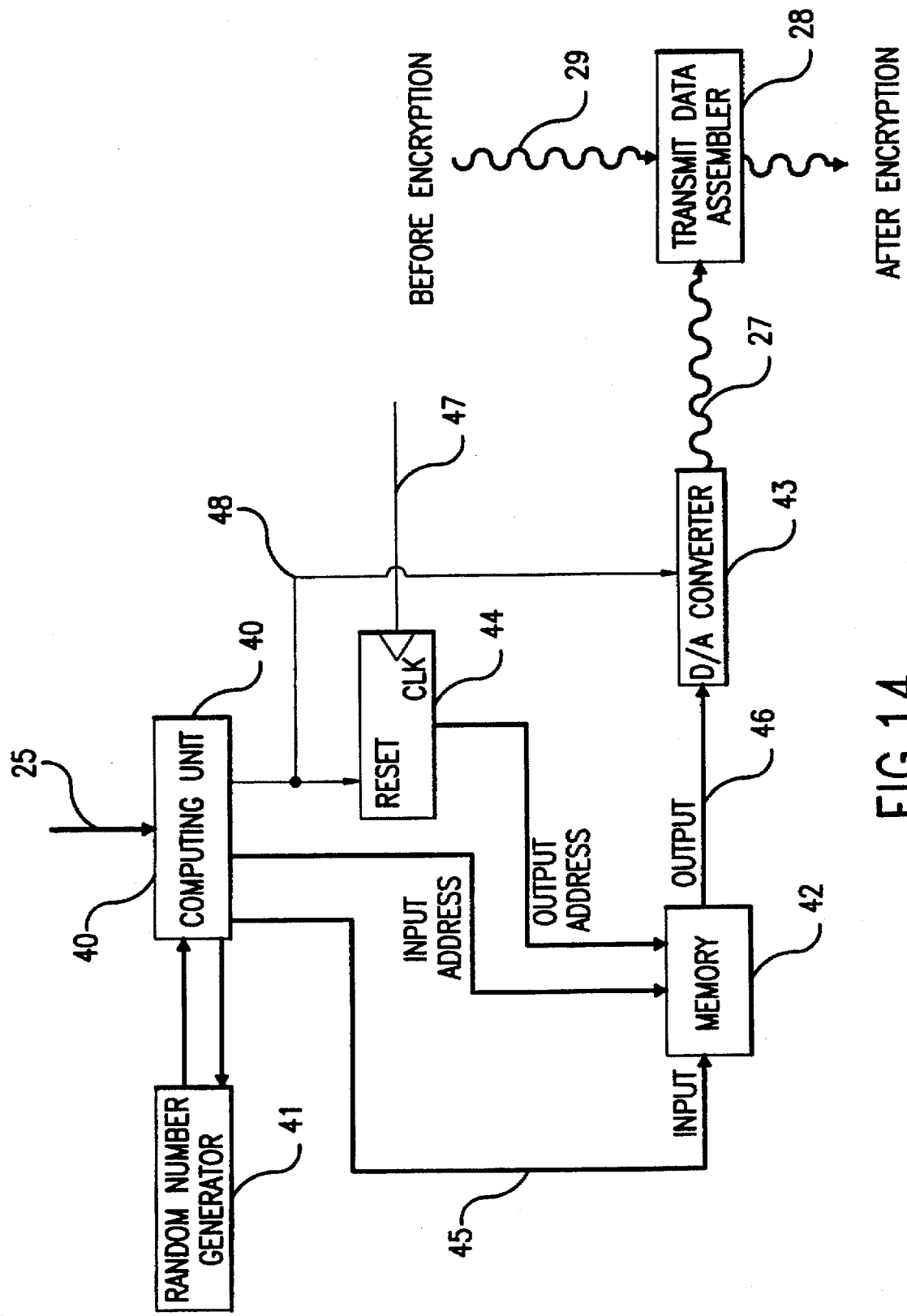
FIG. 14 is a general block diagram of a module generating analog signals conforming with a sequential digital profile.

Referring to FIG. 14, a general structure of the signal generator 26 generating random analog signals conforming with a sequential digital profile 25 taken from the off-line module 15, consists of the following components:
(i) a general application computing unit 40 incorporating a generator 41 of random numbers;
(ii) a dual-port memory unit 42;
(iii) a digital-to-analog converter 43;
(iv) an output address counter 44 for the memory unit 42.

The computing unit 40 receives a sequential digital profile 25 from the off-line module 15, and generates a random sequence of numbers 45 which is memorized in the memory unit 42. The sequence 45 reappears on the output of the memory unit 42 as a digital signal 46 with a sampling period determined by the dock signal 47 connected to the output address counter 44. The digital signal 46 is converted into an output analog signal 27 by the digital-to-analog converter 43. The sequence 45 is generated according to the conditions imposed by said sequential digital profile 25. For example, for the sequential digital profile 25 of FIG. 13, the first numbers of the corresponding sequence 45 should be in an increasing order, and a number corresponding to some randomly selected moment between 0.2 sec and 1.4 sec should reach the magnitude 1.4. The impulse 48 resets the counter 44 and activates the D/A converter 43. Therefore, the process of generation of the output analog signal 27 can be performed either on-line or off-line, depending on the performances of the computing unit 40. If the computing 40 can generate the sequence 45 with a speed exceeding the frequency of the clock 47, the impulse 48 should appear immediately after the first number of the sequence 45 is memorized into the memory unit 42. Otherwise, the impulse 48 should appear after the whole sequence 45 has been memorized into the memory unit 42.

Figure 15A:
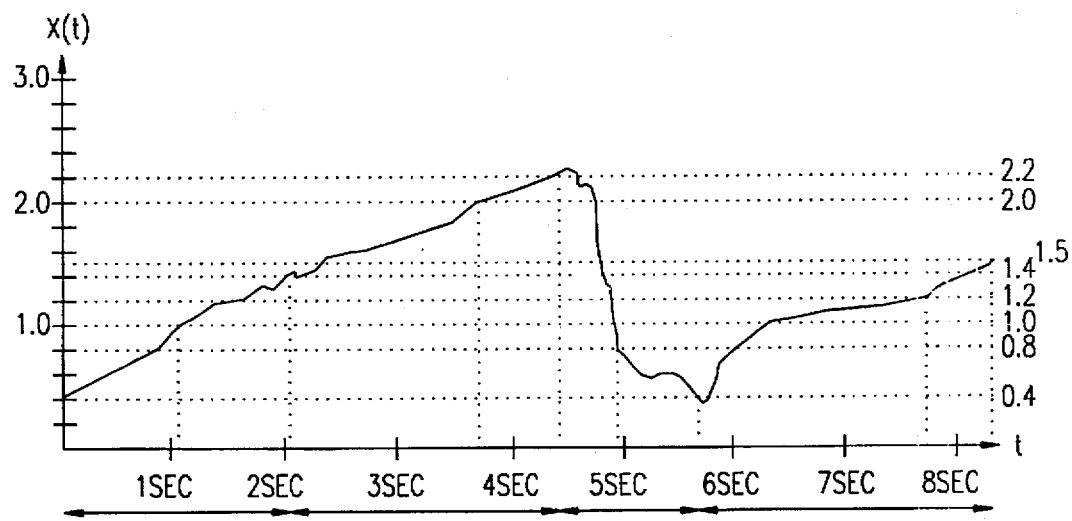
FIG. 15 shows examples of analog signals generated by the module of FIG. 14, and conforming with the sequential digital profile of FIG. 13.
Figure 15B:
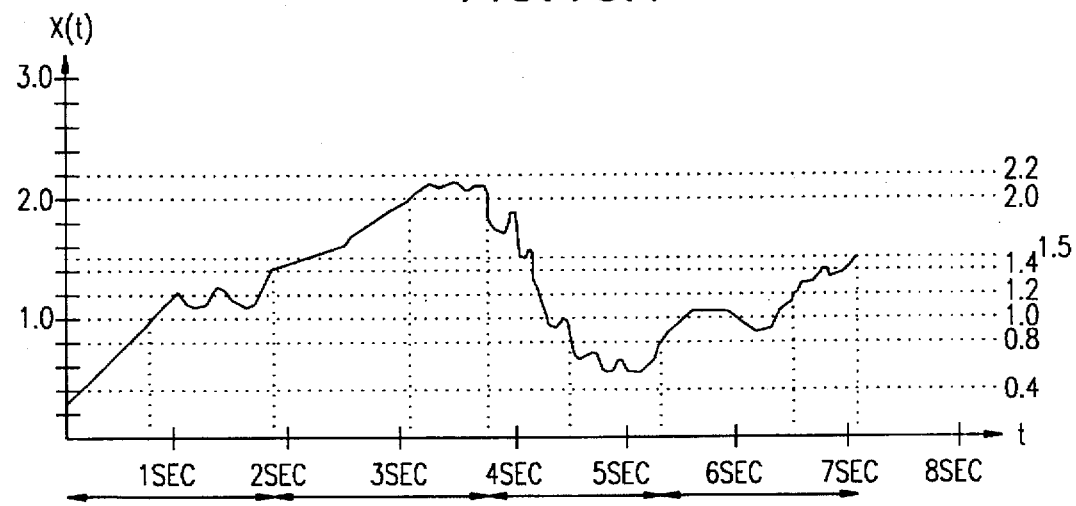
Figure 15C:
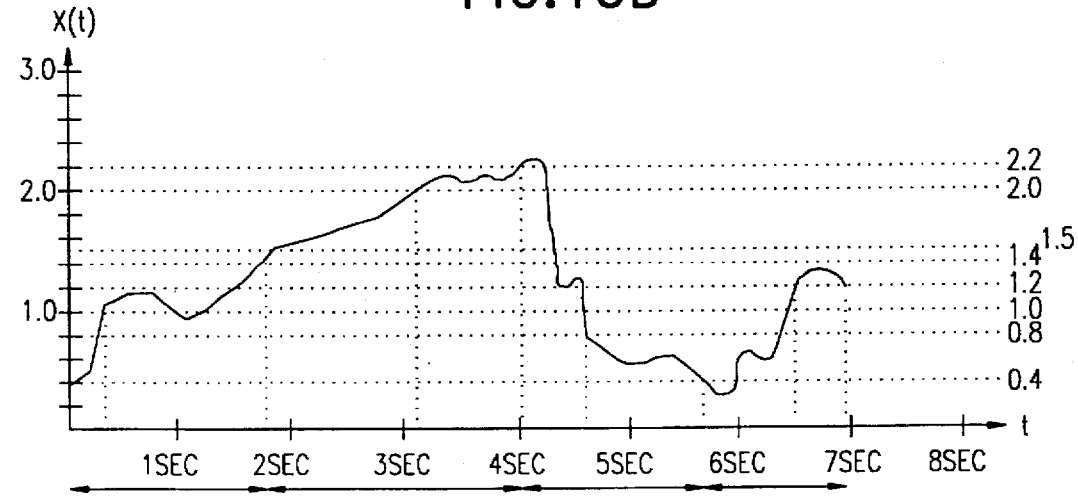

The output signal 27 is being sent to an external transmit data assembler 28 which includes the signal 27 into an encrypted analog signal 29 either as a front-end-identification signal or as an inserted identification signal.

front-end-identification signal and/or any identification signal inserted within FIG. 15 shows examples of generated analog signals conforming with the sequential digital profile 25 of FIG. 13. The fragments 71, 72, 73 and 74 correspond respectively to the samples S1, S2, S3 and S4 of said sequential digital profile 25 of FIG. 13.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A system method for creating digital representation and developing a sequential digital profile from incoming analog signals received from a telephony network, comprising:
   (1) evaluating said incoming analog signals in time domain and generating analog signal templates;
   (2) performing on-line segmentation of said analog signal templates according to a sequence of threshold values such that each element of said sequence of threshold values consist of a low threshold value and a high threshold value;
   (3) representing the results of said segmentation through on-line computation of a sequence of measurements in accordance with selective attributes of said incoming analog signals including off-segment attribute measurements and in-segment attribute measurements;
   (4) determining rules, conditions and algorithms for the development of said sequential digital profile from said results of segmentation and said sequence of measurements, and further selecting an analog signal sequence from said incoming analog signals for converting said analog signal sequence from analog to digital domain;
   (5) applying said sequential digital profile for encryption or decryption of said analog signal sequence through comparing the behavior of front-end-identification fragments of said converted analog signal sequence with said sequential digital profile.

2. A system method of claim 1, further comprising the following steps:
   (i) providing analog filtering utility for translating said analog signal templates into another analog signal templates;

(ii) dividing said translated analog signal templates into a plurality of segments;

(iii) translating said translated analog signal templates into frequency domain and further dividing said translated analog signal template into a plurality of frequency domain segments;

(iv) identifying a set of measurable properties which can be measured on-line in a telephony network wherein said properties only require real or integer number computation either in time or frequency domain;

(v) selecting a unique subset from said measurable properties within each segment which includes: duration, number of local maxima, number of local minima, maximum slope of the segment, minimum slope of the segment, and signal magnitude integration;

(vi) creating a list of attributes in accordance with said selective subset of measurable properties; and (vii) creating a list of corresponding attribute values in accordance with the measurements for said subset of measurable properties.

* * * * *